(12) United States Patent
Youn et al.

(10) Patent No.: US 9,064,603 B1
(45) Date of Patent: Jun. 23, 2015

(54) SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Jae-Youn Youn, Seoul (KR); Su-A Kim, Seongnam-si (KR); Hyo-Jin Choi, Suwon-si (KR); Chul-Woo Park, Yongin-si (KR); Hak-Soo Yu, Seongnam-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/185,302

(22) Filed: Feb. 20, 2014

Related U.S. Application Data

(63) Continuation of application No. 14/091,771, filed on Nov. 27, 2013, now abandoned.

(60) Provisional application No. 61/730,637, filed on Nov. 28, 2012.

(51) Int. Cl.
*G11C 7/10* (2006.01)
*G11C 11/409* (2006.01)

(52) U.S. Cl.
CPC ............ *G11C 11/409* (2013.01); *G11C 7/1045* (2013.01)

(58) Field of Classification Search
CPC ...... G11C 7/22; G11C 7/1045; G11C 7/1006; G11C 7/1072; G06F 12/0866; G06F 13/28; G06F 3/061; G06F 13/1657; G06F 12/08; G06F 3/0685; G06F 3/0683; G06F 12/0875; G06F 1/3268
See application file for complete search history.

(56) References Cited

U.S. PATENT DOCUMENTS

| | | | |
|---|---|---|---|
| 5,701,438 A | 12/1997 | Bains | |
| 7,486,575 B2 | 2/2009 | Park | |
| 7,523,274 B2 | 4/2009 | Ryu et al. | |
| 7,716,411 B2 | 5/2010 | Panabaker et al. | |
| 7,830,730 B2 | 11/2010 | Miura | |
| 7,979,627 B2 | 7/2011 | Arakawa | |
| 8,060,719 B2 | 11/2011 | Radke et al. | |
| 2001/0003198 A1* | 6/2001 | Wu | 711/104 |
| 2004/0221098 A1 | 11/2004 | Ito et al. | |
| 2005/0169091 A1 | 8/2005 | Miki et al. | |
| 2005/0281112 A1 | 12/2005 | Ito et al. | |
| 2005/0286330 A1 | 12/2005 | Ito et al. | |
| 2006/0087893 A1 | 4/2006 | Nishihara et al. | |
| 2007/0171750 A1 | 7/2007 | Oh | |
| 2008/0023741 A1 | 1/2008 | Kang | |
| 2009/0113112 A1 | 4/2009 | Ye et al. | |
| 2009/0157994 A1* | 6/2009 | Hampel et al. | 711/168 |
| 2009/0235145 A1 | 9/2009 | Ito et al. | |
| 2011/0078366 A1 | 3/2011 | Miura et al. | |
| 2011/0246712 A1 | 10/2011 | Vergis et al. | |

FOREIGN PATENT DOCUMENTS

KR 2011/0103829 A 9/2011

* cited by examiner

*Primary Examiner* — Richard Elms
*Assistant Examiner* — Ajay Ojha
(74) *Attorney, Agent, or Firm* — Muir Patent Law, PLLC

(57) ABSTRACT

A semiconductor memory device includes a memory cell array and a control logic. The memory cell array includes first and second sub arrays, the first sub array includes a first set of bank arrays, and the second sub array includes a second set of bank arrays. Each of the upper and lower bank arrays includes first and second portions having different timing parameters with respect to each other. The control logic controls access to the first and second portions such that read/write operation is performed on the first and second portions.

19 Claims, 13 Drawing Sheets

FIG. 6
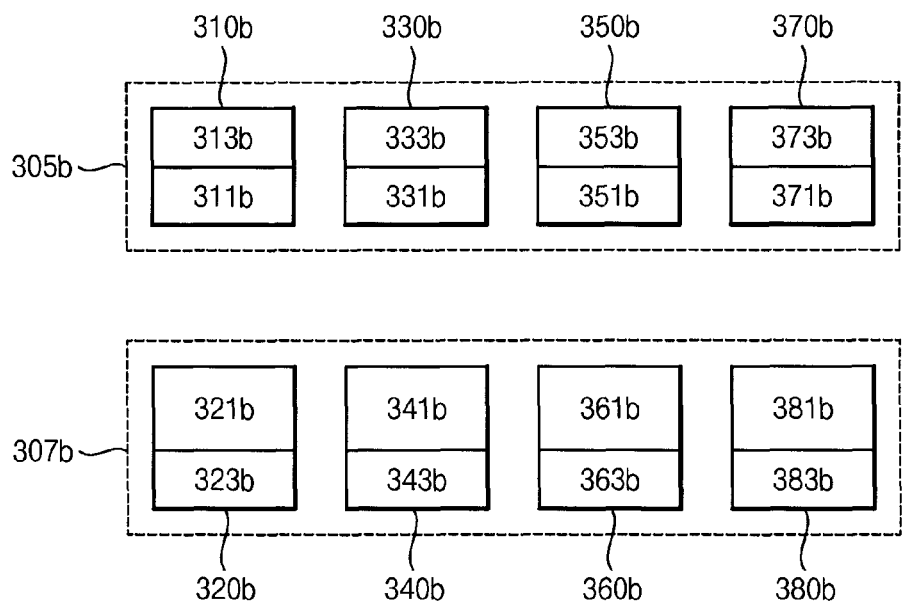
FIG. 7
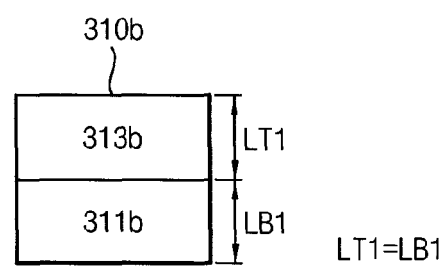
LT1=LB1
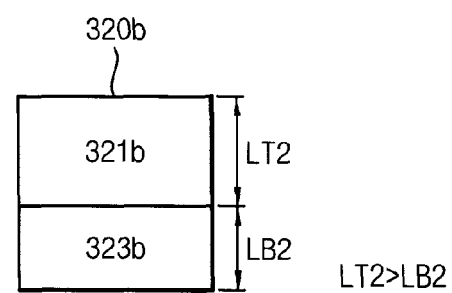
LT2>LB2

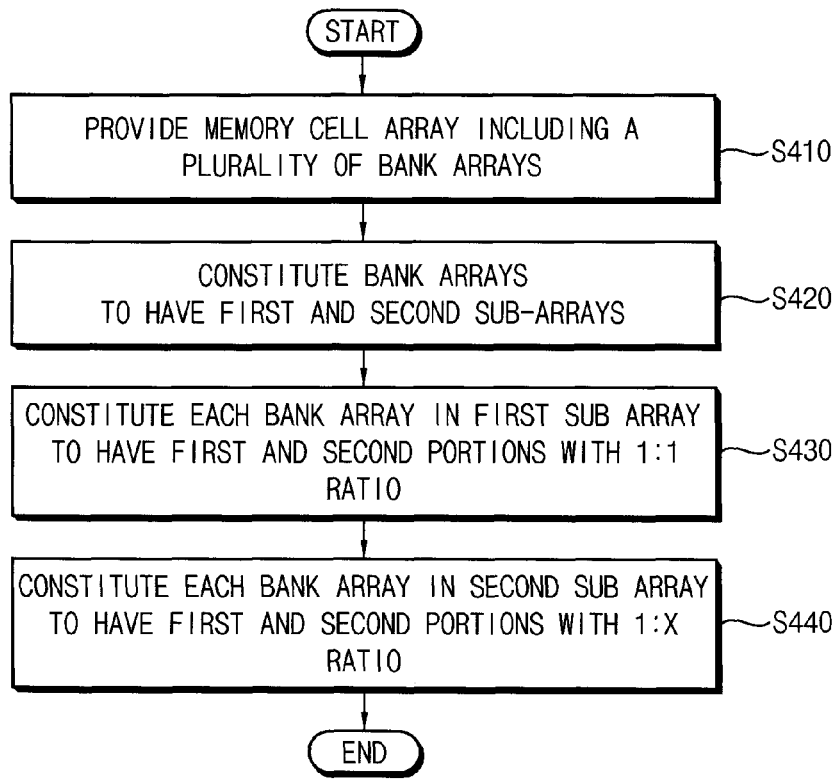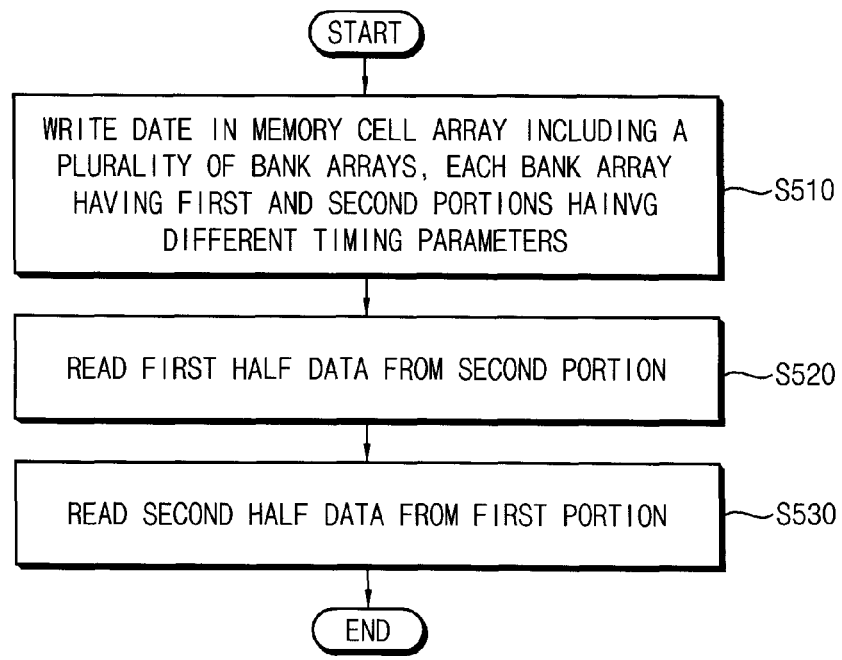

SEMICONDUCTOR MEMORY DEVICE AND MEMORY SYSTEM INCLUDING THE SAME

CROSS-REFERENCE TO RELATED APPLICATION(S)

This U.S. non-provisional application is a continuation application of and claims priority to U.S. patent application Ser. No. 14/091,771, filed Nov. 27, 2013, which claims the benefit of priority under 35 USC §119 to U.S. Provisional Application No. 61/730,637 filed on Nov. 28, 2012 in the USPTO, the contents of each of which are herein incorporated by reference in their entirety.

BACKGROUND

1. Technical Field

This disclosure relates to memory devices, and more particularly to a semiconductor memory device and a memory system including the same.

2. Discussion of the Related Art

Semiconductor memory devices operate according to specifications of timing parameters such as a memory cell data write time, a word line activation time, and a precharge time. Timing parameters increase as a semiconductor process shrinks, thereby reducing semiconductor yield. Some semiconductor memory devices store data that benefits from or requires a faster access time, while storing additional data that does not need as fast of an access time. However, to accommodate for the data that benefits from or requires the faster access time, such semiconductor memory devices may operate according to a specification that includes faster timing parameters. Such faster timing parameters may use additional power, which is not needed for the data that can use slower timing parameters.

SUMMARY

Some example embodiments provide a semiconductor memory device capable of minimizing degradation of timing parameters and enhancing performance.

Some example embodiments provide a memory system including a volatile memory device.

In some example embodiments, a semiconductor memory device includes a memory cell array and a control logic. The memory cell array includes first and second sub arrays, the first sub array includes a first set of bank arrays, and the second sub array includes a second set of bank arrays. Each of the first set and second set of bank arrays includes first and second portions having different timing parameters with respect to each other. The control logic controls access to the first and second portions such that read/write operation is performed on the first and second portions. When unit sizes of data are successively written in the second and first portions in response to a write command, the control logic controls the access such that a second data of the unit size, received after a first data of the unit size, is written in the first portion before the first data of the unit size is written in the second portion.

In one embodiment, the first portion may have a first timing parameter and the second portion may have a second timing parameter, the first timing parameter may be longer than the second timing parameter, and the control logic may be configured to control the access to the first and second portions in response to a read/write command using separate data lines and separate column selection lines.

The second portion may store data which are accessed more frequently than a reference value.

The first portion may store data which are accessed less frequently than a reference value.

When unit sizes of data are successively written in the second and first portions in response to a write command, the control logic may control the access such that a second data of the unit size received after a first data of the unit size is written in the first portion before the first data of the unit size is written in the second portion.

When unit sizes of data are successively read from the second and first portions in response to a read command, the control logic may control the access such that a first data of the unit size is read from the second portion before a second data of the unit size is read from the first portion.

The control logic may be configured to cause a first column selection signal to the second data to be activated with a delay with respect to a second column selection signal to the first data, and to cause activation intervals of the first and second column selection signals to be partially overlapped with respect to each other.

The control logic may be configured to cause the second data to be read from the first portion in response to the first column selection signal while the first data read from the second portion in response to the second column selection signal are provided externally from a data input/output (I/O) buffer.

Data with different sizes may be written to the first and second portions respectively.

A greater amount of data may be written to the first portion than the second portion.

In an embodiment, the first portion and the second portion of each array of the first set of bank arrays and the second set of bank arrays may have first and second memory capacities which are the same with respect to each other.

In one embodiment, the first portion and the second portion of each array of the first set of bank arrays may have first and second memory capacities which are the same with respect to each other and the first portion and the second portion of each array of the second set of bank arrays may have third and fourth memory capacities which are different with respect to each other.

The third memory capacity may be greater than the fourth memory capacity.

In one embodiment, the semiconductor memory device may be a DRAM.

In some example embodiments, a memory system includes a semiconductor memory device that stores data and a memory controller that controls the semiconductor memory device. The semiconductor memory device includes a memory cell array and a control logic. The memory cell array includes first and second sub arrays, the first sub array includes a first set of bank arrays, and the second sub array includes a second set of bank arrays. Each array of the first set and second set of bank arrays includes first and second portions having different timing parameters with respect to each other. The control logic controls access to the first and second portions such that read/write operation is performed on the first and second portions. When unit sizes of data are successively written in the second and first portions in response to a write command, the control logic controls the access such that a second data of the unit size, received after a first data of the unit size, is written in the first portion before the first data of the unit size is written in the second portion.

Accordingly, the semiconductor memory device includes a memory cell array having a plurality of bank arrays, each having first and second portions having different timing parameters. When performing read operation and write operation, slow characteristic of the first portion may be hidden externally. In addition, low power requirement may be satisfied by storing data allowed for longer access time in the first portion and high performance requirement may be satisfied by storing data requiring shorter access time in the second portion.

In one embodiment, a method of controlling a semiconductor memory device is disclosed. The semiconductor memory device includes a memory cell array including at least a first bank array having a fast cell array portion and a slow cell array portion having slower access time than the fast cell array portion. The method includes: receiving a read/write command for a first data of a unit size and a second data of the unit size, the first received data allowing for a first access time, and the second received data designated for a second access time faster than the first access time; writing the first data to or reading the first data from the slow cell array portion; and writing the second data to or reading the second data from the fast cell array portion.

The method may additionally include: receiving the second data for writing prior to receiving the first data for writing; and writing the first data to the slow cell array portion and subsequently writing the second data to the fast cell array portion.

The method may additionally include: outputting the first data from the slow array portion to a data input/output (I/O); and outputting the second data from the fast array portion to the data I/O buffer, wherein the first data and the second data are at least partly output to the data I/O buffer at the same time.

A column selection line for reading the second data from the fast array portion may be enabled prior to a column selection line for reading the first data from the slow array portion.

The column selection line for reading the second data from the fast array portion may be separate from the column selection line for reading the first data from the slow array portion.

The second data from the fast array portion may be supplied to a controller as read data prior to the first data from the slow array portion being supplied to the controller as read data.

One embodiment includes writing data having a first size to the fast array portion, and writing data having a second size larger than the first size to the slow array portion.

BRIEF DESCRIPTION OF THE DRAWINGS

Illustrative, non-limiting exemplary embodiments will be more clearly understood from the following detailed description taken in conjunction with the accompanying drawings.

FIG. 6 is a block diagram illustrating an example of the memory cell array in FIG. 3 according to some example embodiments.

FIG. 7 illustrates an example of the first and second bank arrays of the bank arrays in FIG. 6.

FIG. 11 is a flow chart illustrating a method of operating the semiconductor memory device according to some example embodiments.

FIG. 12 is a flow chart illustrating a data input/output method of the semiconductor memory device according to some example embodiments.

DETAILED DESCRIPTION OF THE EMBODIMENTS

Figure 1:
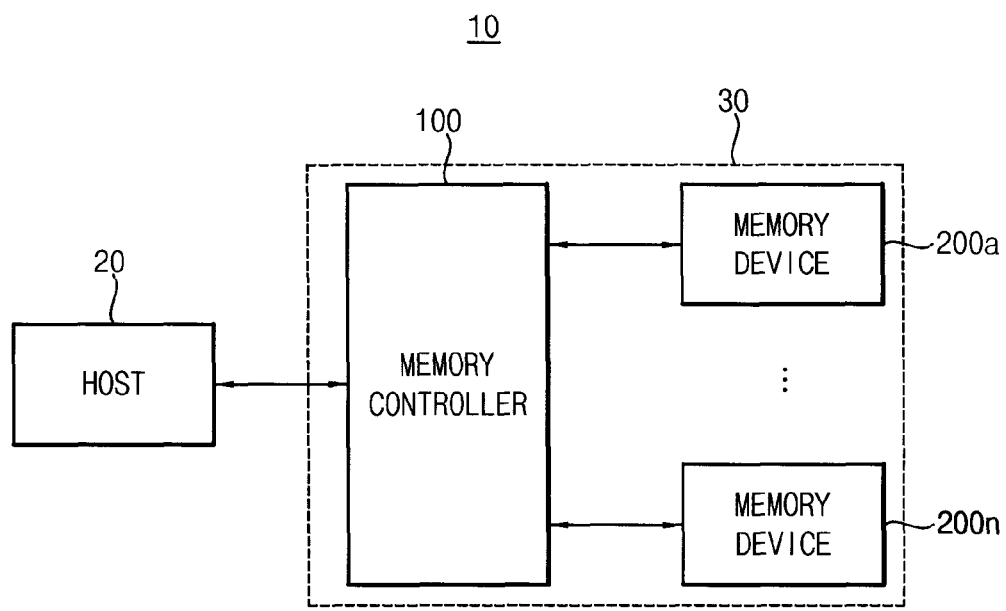
FIG. 1 is a block diagram illustrating an electronic system according to some example embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless the context indicates otherwise, these terms are generally used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to some example embodiments.

Referring to FIG. 1, an electronic system 10 includes a host 20 and a memory system 30. The memory system 30 includes a memory controller 100 and a plurality of memory devices 200a~200n.

The host 20 may communicate with the memory system 30 through an interface protocol such as, for example, Peripheral Component Interconnect-Express (PCI-E), Advanced Technology Attachment (ATA), Serial ATA (SATA), Parallel ATA (PATA), or serial attached SCSI (SAS). In other examples, the host 20 may communicate with the memory system 30 through an interface protocol such as Universal Serial Bus (USB), Multi-Media Card (MMC), Enhanced Small Disk Interface (ESDI), or Integrated Drive Electronics (IDE).

The memory controller 100 controls overall operation of the memory system 30. For example, the memory controller 100 may control data exchange between the host 20 and the memory devices 200a~200n. For example, the memory controller 100 writes data to the memory devices 200a~200n or reads data from the memory devices 200a~200n in response to requests from the host 20.

In addition, the memory controller 100 applies operation commands to the memory devices 200a~200n for controlling the memory devices 200a~200n.

In some embodiments, each of the memory devices 200a~200n may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other types of volatile memory devices that require a refresh operation.

Figure 2:
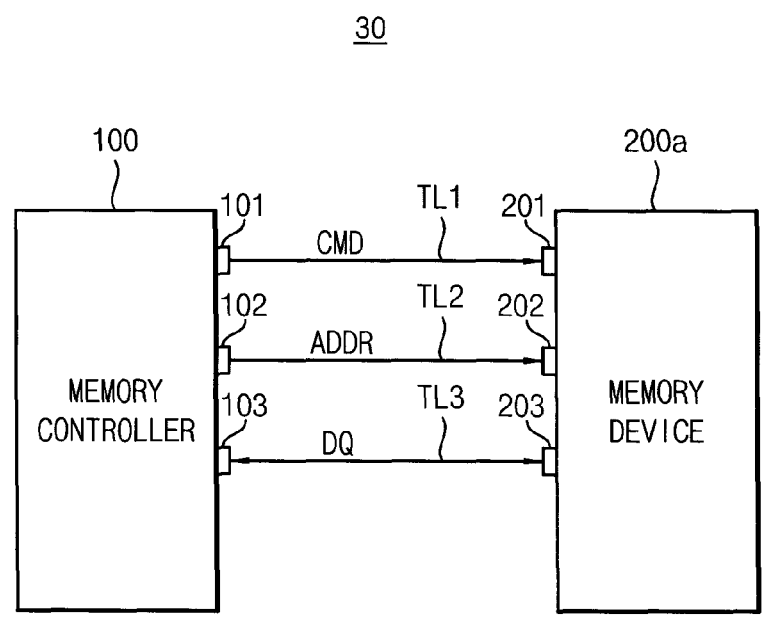
FIG. 2 is a block diagram illustrating an example of the memory system in FIG. 1 according to an embodiment.

FIG. 2 is a block diagram illustrating an example of the memory system in FIG. 1 according to one embodiment.

In FIG. 2, one memory device 200a corresponding to the memory controller 100 is illustrated for convenience.

Referring to FIG. 2, the memory system 30 includes the memory controller 100 and the memory device 200a. The memory controller 100 and the memory device 200a may be connected to each other through corresponding command pins 101 and 201, corresponding address pins 102 and 202 and corresponding data pins 103 and 203. The command pins 101 and 201 transmit a command signal CMD through a command transmission line TL1, the address pins 102 and 202 transmit an address signal ADDR through an address transmission line TL2, and the data pins 103 and 203 exchange data DQ through a data transmission line TL3. Therefore, the command pins 101 and 201, address pins 102 and 202, and data pins 103 and 203, may comprise external connection terminals for the respective memory controller 100 and memory device 200a. Each pin is connected between circuitry of the respective memory controller 100 or memory device 200a, and respective transmission lines TL1-TL3.

Referring to FIGS. 1 and 2, the memory controller 100 may input data to the memory device 200a or may receive data output from the memory device 200a through the data pins 103 and 203 based on the request from the host 20. In addition, the memory controller 100 outputs addresses to the memory device 200a.

Figure 3:
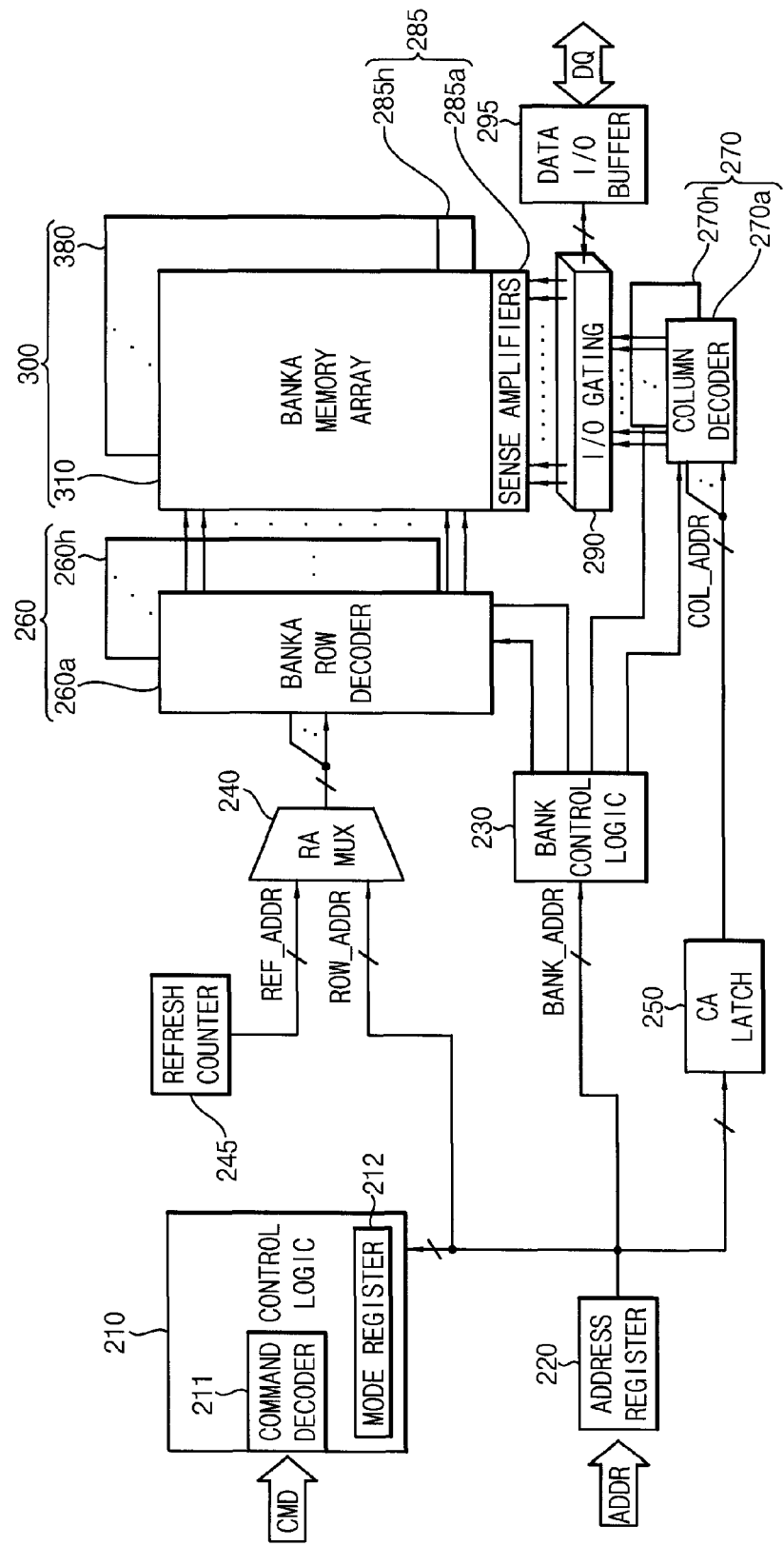
FIG. 3 is a block diagram illustrating an example of the memory device in FIG. 2 according to some example embodiments.

FIG. 3 is a block diagram illustrating an example of the memory device in FIG. 2 according to some example embodiments.

Referring to FIG. 3, the memory device 200a includes a control logic 210, an address register 220, a bank control logic 230, a row address multiplexer 240, a column address latch 250, a row decoder 260, a column decoder 270, a memory cell array 300, a sense amplifier unit 285, an input/output gating circuit 290, a data input/output buffer 295 and a refresh counter 245.

The memory cell array 300 may include a plurality of bank arrays, such as first through eighth bank arrays 310~380. The row decoder 260 may include a plurality of bank row decoders, such as first through eighth bank row decoders 260a~260h respectively coupled to the first through eighth bank arrays 310~380, the column decoder 270 may include a plurality of bank column decoders, such as first through eighth bank column decoders 270a~270h respectively coupled to the first through eighth bank arrays 310~380, and the sense amplifier unit 285 may include a plurality of bank sense amplifiers, such as first through eighth bank sense amplifiers 285a~285h respectively coupled to the first through eighth bank arrays 310~380. First through eighth bank arrays 310~380, the first through eighth bank row decoders 260a~260h, the first through eighth bank column decoders 270a~270h and the first through eighth bank sense amplifiers 285a~285h may form first through eighth banks Although the semiconductor memory device 200a is illustrated in FIG. 3 as including eighth banks, the semiconductor memory device 200a may include any number of banks.

In one embodiment, the address register 220 is configured to receive an address ADDR including a bank address BANK_ADDR, a row address ROW_ADDR and a column address COL_ADDR from a memory controller (not shown). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank row decoders 260a~260h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR. A row address output from the row address multiplexer 240 may be applied to the first through eighth bank row decoders 260a~260h.

In one embodiment, the activated one of the first through eighth bank row decoders 260a~260h decodes the row address output from the row address multiplexer 240, and activates a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 generates column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR output from the column address latch 250, and may control the input/output gating circuit 290 to output data corresponding to the column address COL_ADDR.

The input/output gating circuit 290 may include circuitry for gating input/output data. The input/output gating circuit 290 may further include an input data mask logic, read data latches for storing data output from the first through eighth bank arrays 310~380, and write drivers for writing data to the first through eighth bank arrays 310~380.

Data DQ to be read from one bank array of the first through eighth bank arrays 310~380 may be sensed by a sense amplifier coupled to the one bank array, and may be stored in the read data latches. The data DQ stored in the read data latches may be provided to the memory controller via the data input/output buffer 295. Data DQ to be written to one bank array of first through eighth bank arrays 310~380 may be provided from the memory controller to the data input/output buffer 295. The data DQ provided to the data input/output buffer 295 may be written to the one array bank via write drivers.

The control logic 210 controls operations of the memory device 200a. The control logic 210 may include circuitry for implementing the logic. For example, the control logic 210 may generate control signals for the semiconductor memory device 200a to perform a write operation or a read operation. The control logic 210 may include a command decoder 211 that decodes a command CMD received from the memory controller and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc.

As will be described later, each of the first through eighth bank arrays 310~380 may include first and second portions having different timing parameters, and a first timing parameter of the first portion may be longer than a second timing parameter of the second portion. Therefore, data that allows for longer access time may be stored in the first portion and data requiring or benefiting from shorter access time may be stored in the second portion. In addition, data having smaller access frequency than a reference value may be stored in the first portion and data having greater access frequency than the reference value may be stored in the second portion.

In a semiconductor memory device 200a, examples of timing parameters include a row cycle time tRC, a /RAS-to-/CAS time tRCD, a write recovery time tWR, a row precharge time tRP, and a row active-to-row active time tRRD. A longer timing parameter may correspond to a longer access time for one or more cells of a memory cell array. One or more of these timing parameters may be characterized based on the number of clock cycles included in the timing parameter. Therefore, in certain embodiments, a timing parameter described as "longer" than another timing parameter would have a greater number of clock cycles. As such, a longer timing parameter, such as a longer access time, may use a greater number of clock cycles. This type of timing parameter may be considered a digital timing parameter, which can be contrasted with a delay such as a propagation delay, which may be considered an analog timing delay. Cells or arrays that have longer timing parameters are also referred to herein as slow arrays, slow cell areas, or slow array portions; and cells or arrays that have shorter timing parameters are also referred to herein as fast arrays, fast array areas, or fast array portions.

The row cycle time tRC represents a time between an active command and a next active command. The /RAS-to-/CAS time tRCD represents a time between the applying of a /RAS signal and the applying of a /CAS signal, for example, a time between a row active command and a column active command. The write recovery time tWR represents a time between the enabling of a word line and the writing of data to a memory cell. The row precharge time tRP represents a time between the write recovery time tWR and the precharging of a bit line in order to prepare a next active command. The row active-to-row active time tRRD represents a time between a row active command and a row active command, such as, for example, a row active-to-row active time between different banks Each of the first through eighth bank arrays 310~380 may include first and second portions having different timing parameters, and a first timing parameter of the first portion may be longer than a second timing parameter of the second portion. For example, the first portion may include second memory cells, and characteristics of the first memory cells such as configuration and AC timing parameters requires or benefits from the first timing parameter. The second portion may include second memory cells, and characteristics of the second memory cells allow for the second timing parameter.

Therefore, low power consumption may be accomplished by writing data to the first portion and reading data from the first portion, and high performance (e.g., high access speeds) may be accomplished by writing data to the second portion and reading data from the second portion.

Figure 4:
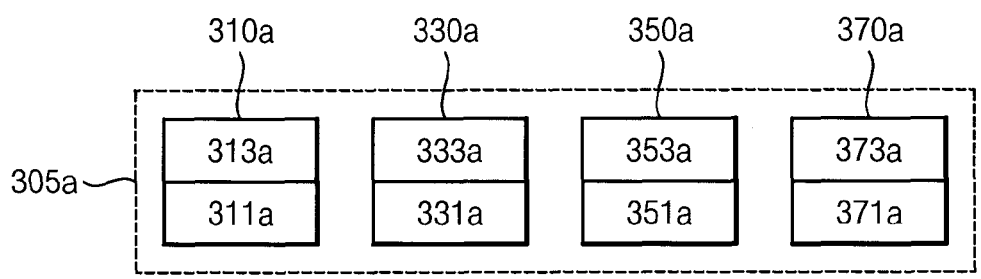
FIG. 4 is a block diagram illustrating an example of the memory cell array in FIG. 3 according to some example embodiments.

FIG. 4 is a block diagram illustrating an example of the memory cell array in FIG. 3 according to some example embodiments.

Referring to FIG. 4, a memory cell array 300a includes first through eighth bank arrays 310a~380a. The first, third, fifth and seventh bank arrays 310a, 330a, 350a and 370a may constitute a first sub array 305a and the second, fourth, sixth and eighth bank arrays 320a, 340a, 360a and 380a may constitute a second sub array 307a. The first, third, fifth and seventh bank arrays 310a, 330a, 350a and 370a may be referred to as a first set of bank arrays, and the second, fourth, sixth and eighth bank arrays 320a, 340a, 360a and 380a may be referred to as a second set of bank arrays.

The first bank array 310a includes first and second portions 311a and 313a, the second bank array 320a includes first and second portions 321a and 323a, the third bank array 330a includes first and second portions 331a and 333a, the fourth bank array 340a includes first and second portions 341a and 343a, the fifth bank array 350a includes first and second portions 351a and 353a, the sixth bank array 360a includes first and second portions 361a and 363a, the seventh bank array 370a includes first and second portions 371a and 373a, and the eighth bank array 380a includes first and second portions 381a and 383a.

In each of the first through eight bank arrays 310a~380a, first data capacity for each of the first portions 311a, 321a, 331a, 341a, 351a, 361a, 371a and 381a may be same as second data capacity for each of the second portions 313a, 323a, 333a, 343a, 353a, 363a, 373a and 383a.

In one embodiment, the first timing parameter of each of the first portions 311a, 321a, 331a, 341a, 351a, 361a, 371a and 381a may be longer than the second timing parameter of each of the second portions 313a, 323a, 333a, 343a, 353a, 363a, 373a and 383a. Therefore, data that allows for longer access time may be stored in the first portions 311a, 321a, 331a, 341a, 351a, 361a, 371a and 381a and data that benefits from or requires shorter access time may be stored in the second portions 313a, 323a, 333a, 343a, 353a, 363a, 373a and 383a. In addition, data having smaller access frequency than a reference value may be stored in each of the first portions 311a, 321a, 331a, 341a, 351a, 361a, 371a and 381a and data having greater access frequency than the reference value may be stored in each of the second portions 313a, 323a, 333a, 343a, 353a, 363a, 373a and 383a.

Figure 5:
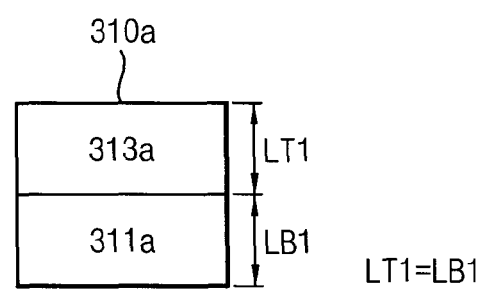
FIG. 5 illustrates an example of the first bank array of the bank arrays in FIG. 4.

FIG. 5 illustrates an example of the first bank array of the bank arrays in FIG. 4.

Each of the second through eighth bank arrays 320a~380a may have a substantially same configuration as the first bank array 310a.

Referring to FIG. 5, in the first bank array 310a, a width LB1 in a first direction of the first portion 311a may be same as a width LT1 in the first direction of the second portion 313a. In one embodiment, since the first and second portions 311a and 313a have the same width in a second direction (e.g., perpendicular to the first direction), the first and second portions 311a and 313a have the same number of memory cells. Each number of memory cells connected to one bit-line and one word-line in the first portion 311a may be the same as each number of memory cells connected to one bit-line and one word-line in the second portion 313a.

FIG. 6 is a block diagram illustrating an example of the memory cell array in FIG. 3 according to some example embodiments.

Referring to FIG. 6, a memory cell array 300b includes first through eighth bank arrays 310b~380b. The first, third, fifth and seventh bank arrays 310b, 330b, 350b and 370b may constitute a first sub array 305b and the second, fourth, sixth and eighth bank arrays 320b, 340b, 360b and 380b may constitute a second sub array 307b. The first, third, fifth and seventh bank arrays 310b, 330b, 350b and 370b may be referred to as a first set of bank arrays, and the second, fourth, sixth and eighth bank arrays 320b, 340b, 360b and 380b may be referred to as a second set of bank arrays.

The first bank array 310b includes first and second portions 311b and 313b, the second bank array 320b includes first and second portions 321b and 323b, the third bank array 330b includes first and second portions 331b and 333b, the fourth bank array 340b includes first and second portions 341b and 343b, the fifth bank array 350b includes first and second portions 351b and 353b, the sixth bank array 360b includes first and second portions 361b and 363b, the seventh bank array 370b includes first and second portions 371b and 373b, and the eighth bank array 380b includes first and second portions 381b and 383b.

In each of the first, third, fifth and seventh bank arrays 310b, 330b, 350b and 370b, a first data capacity in each of the first portions 311b, 331b, 351b, and 371b may be the same as a second data capacity in each of the second portions 313b, 333b, 353b, and 373b. In each of the second, fourth, sixth and eighth bank arrays 320b, 340b, 360b and 380b, a third data capacity in each of the first portions 321b, 341b, 361b, and 381b may be different from a fourth data capacity in each of the second portions 323b, 343b, 363b, and 383b. In one embodiment, the third data capacity is greater than the fourth data capacity (as depicted in the figure for example by the larger size of the array).

In one embodiment, the first timing parameter of each of the first portions 311b, 321b, 331b, 341b, 351b, 361b, 371b and 381b is longer than the second timing parameter of each of the second portions 313b, 323b, 333b, 343b, 353b, 363b, 373b and 383b. For example, as discussed above, the first timing parameter may be associated with a greater number of clock cycles than the second timing parameter. Therefore, data that allows for longer access time may be stored in each of the first portions 311b, 321b, 331b, 341b, 351b, 361b, 371b and 381b and data that benefits from or requires shorter access time may be stored in the second portions 313b, 323b, 333b, 343b, 353b, 363b, 373b and 383b. In addition, data having smaller access frequency than a reference value may be stored in each of the first portions 311b, 321b, 331b, 341b, 351b, 361b, 371b and 381b and data having greater access frequency than the reference value may be stored in each of the second portions 313b, 323b, 333b, 343b, 353b, 363b, 373b and 383b. The data may be stored in an appropriate array portion based on one or more instructions of control logic (e.g., based on instructions from memory controller 100).

FIG. 7 illustrates an example of the first and second bank arrays of the bank arrays in FIG. 6.

In FIG. 6, each of the third, fifth and seventh bank arrays 330b, 350b and 370b may have a substantially same configuration as the first bank array 310b, and each of the fourth, sixth and eighth bank arrays 340b, 360b and 380b may have a substantially same configuration as the second bank array 320b.

Referring to FIG. 7, in the first bank array 310b (shown in a plan view), a width LB1 in a first direction of the first portion 311b may be same as a width LT1 in the first direction of the second portion 313b. In one embodiment, since the first and second portions 311b and 313b have same width in a second direction perpendicular to the first direction, the first and second portions 311b and 313b have a same number of memory cells. Each number of memory cells connected to one bit-line and one word-line in the first portion 311b may be the same as each number of memory cells connected to one bit-line and one word-line in the second portion 313b. In the second bank array 320b, a width LT2 in a first direction of the first portion 321b may be different from a width LB2 in the first direction of the second portion 323b. The for example, the width LT2 in the first direction of the first portion 321b may be greater than the width LB2 in the first direction of the second portion 323b. In one embodiment, since the first and second portions 321b and 323b have same width in a second direction perpendicular to the first direction, the first portion 321b may include greater number of memory cells than the second portions 323b. In one embodiment, the number of memory cells connected to each bit-line in the first portion 321b is greater than the number of memory cells connected to each bit-line in the second portion 323b.

Figure 8:
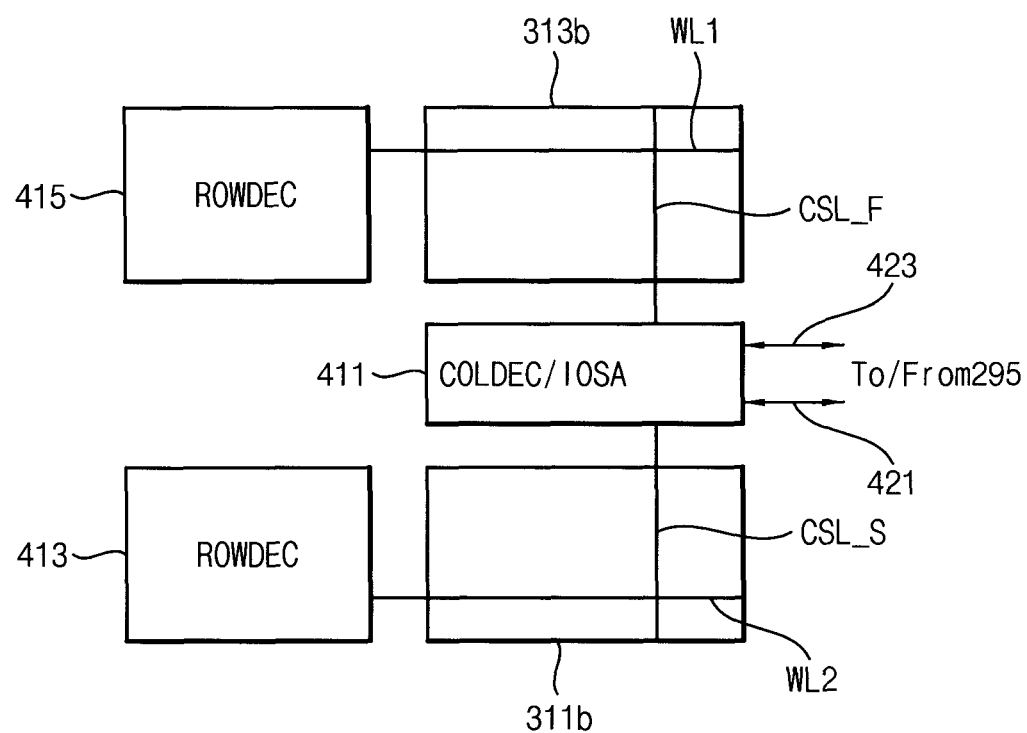
FIG. 8 illustrates a configuration of a memory bank including the first bank array in FIG. 7.

FIG. 8 illustrates an exemplary configuration of a memory bank including the first bank array in FIG. 7.

Referring to FIG. 8, a memory bank including the first bank array 310b includes the first portion 311b, the second portion 313b, a first row decoder 413, a second row decoder 415 and a column decoder and I/O sense amplifier 411.

The first row decoder 413 selects one of the memory cell rows in the first portion 311b in response to a row address signal, and the second row decoder 415 selects one of the memory cell rows in the second portion 313b in response to a row address signal. The column decoder and I/O sense amplifier 411 is shared by the first and second portions 311b and 313b, and is coupled to first and second column selection lines CSL_S and CSL_F. The column decoder and I/O sense amplifier 411 may sequentially activate the first and second column selection lines CSL_S and CSL_F to access the first and second portions 311b and 313b. Data input to/output from the first portion 311b through the first column selection line CSL_S is provided to the data I/O buffer 295 via a first data line 421, and data input to/output from the second portion 313b through the second column selection line CSL_F is provided to the data I/O buffer 295 via a second data line 423. As such, the control logic 210 controls data access to the first and second portions 311b and 313b using separate data lines 421 and 423 and separate column selection lines CSL_S and CSL_F. For example, rather than a single continuous column selection line that connects continuously to cells in both the first and second portions 311b and 313b, two separated column selection lines may connect to the cells, with a break in between. The break, in this case, is caused by the column decoder and I/O sense amplifier 411. Thus, in one embodiment, the two column selection lines and two data lines may be aligned in a single column, but may include two separated parts.

Figure 9A:
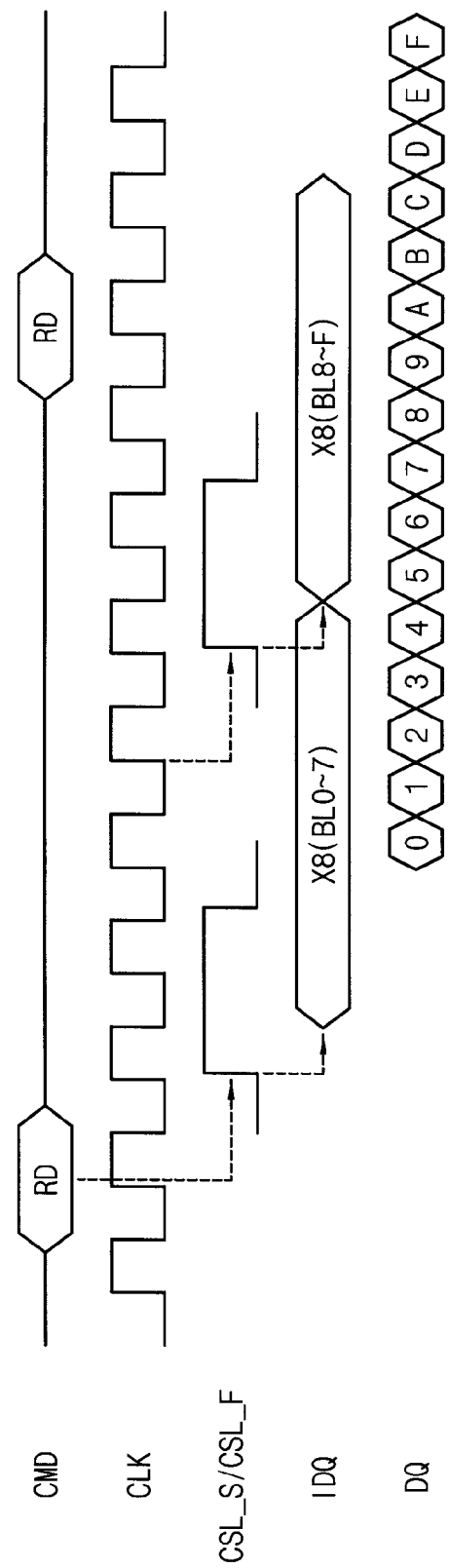
FIG. 9A is a timing diagram illustrating read operation of the conventional semiconductor memory device to be compared with example embodiments.

FIG. 9A is a timing diagram illustrating read operation of the conventional semiconductor memory device to be compared with example embodiments.

Figure 9B:
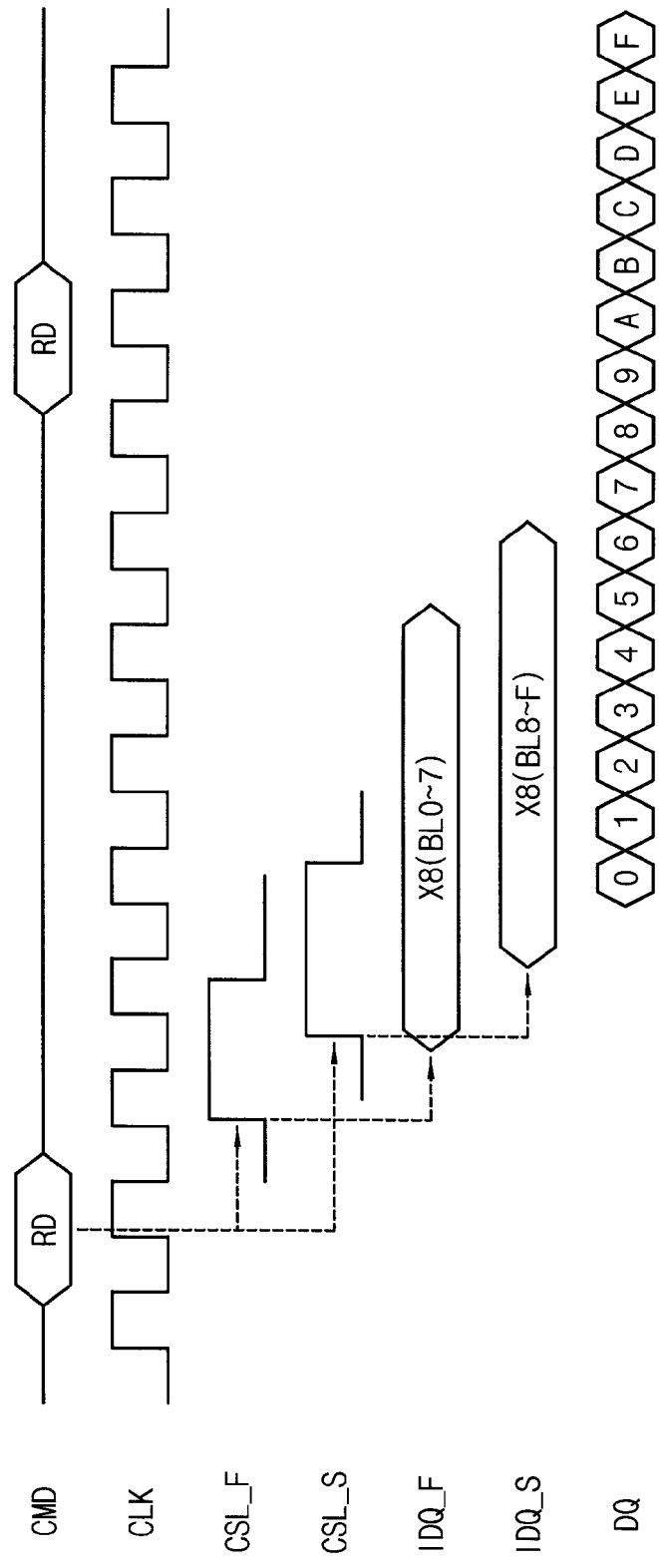
FIG. 9B is a timing diagram illustrating read operation of the semiconductor memory device according to some example embodiments.

FIG. 9B is a timing diagram illustrating read operation of the semiconductor memory device according to some example embodiments.

Referring to FIG. 9A, in the conventional semiconductor memory device, for performing read operation, the column selection lines CSL for a first unit data BL0~7 and a second unit data BL8~F are sequentially activated in response to read command RD, corresponding internal data IDQ are provided to the data I/O buffer 295, and read data DQ are sequentially provided to the memory controller 100.

Referring to FIG. 9B, in the semiconductor memory device according to example embodiments, for performing read operation, the second column selection line CSL_F is activated in advance for reading first unit data stored in the second portion 313b, and the first column selection line CSL_S is activated with a delay with respect to the second column selection line CSL_F for reading second unit data stored in the first portion 311b, in response to the read command RD. Since the separate column selection lines CSL_F and CSL_S are used, activation intervals of the second and first column selection lines CSL_F and CSL_S are partially overlapped.

The first unit data stored in the second portion 313b is provided to the data I/O buffer 295 as first internal data IDQ_F in response to an activation of the second column selection line CSL_F. While the first internal data IDQ_F is provided to the data I/O buffer 295, the second unit data stored in the first portion 311b is provided to the data I/O buffer 295 as second internal data IDQ_S in response to an activation of the first column selection line CSL_S. While the first internal data IDQ_F is arranged in the data I/O buffer 295 and is provided to the memory controller 100, the second internal data IDQ_S is provided to the data I/O buffer 295. Accordingly, a slow characteristic of the first timing parameter of the first portion 311b may be hidden externally. The first and second internal data IDQ_F and IDQ_S are sequentially output to the memory controller 100 from the data I/O buffer 295 as read data DQ.

Figure 10A:
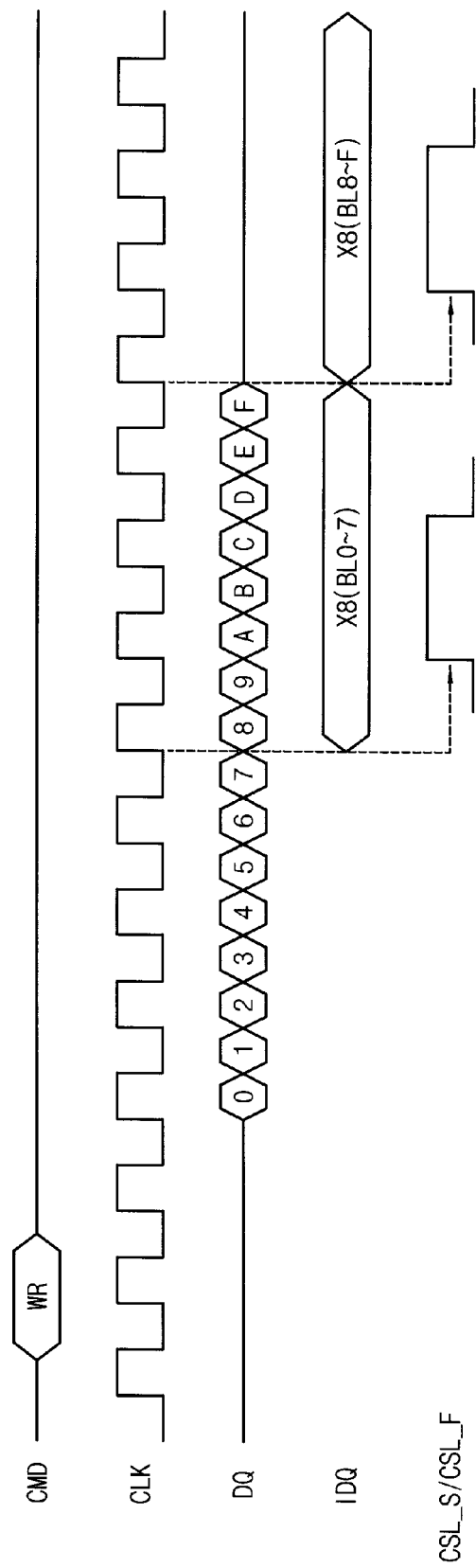
FIG. 10A is a timing diagram illustrating write operation of the conventional semiconductor memory device to be compared with example embodiments.

FIG. 10A is a timing diagram illustrating write operation of the conventional semiconductor memory device to be compared with example embodiments.

Figure 10B:
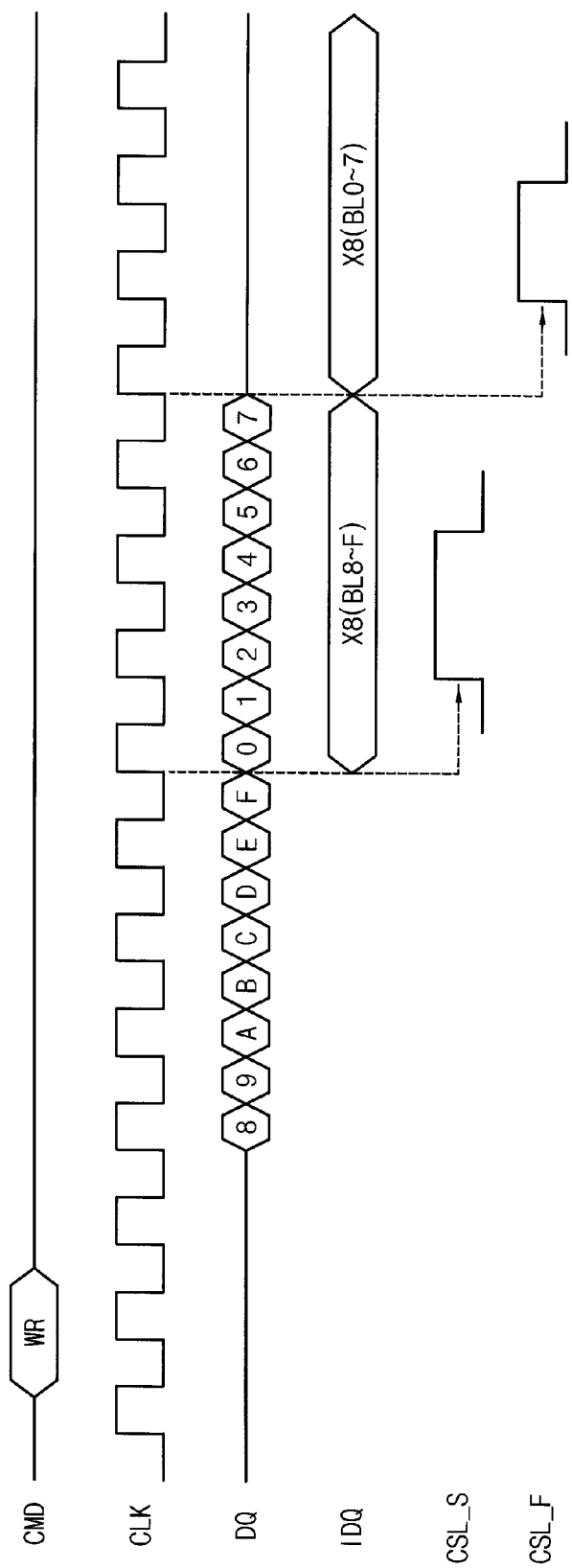
FIG. 10B is a timing diagram illustrating write operation of the semiconductor memory device according to some example embodiments.

FIG. 10B is a timing diagram illustrating write operation of the semiconductor memory device according to some example embodiments.

Referring to FIG. 10A, in the conventional semiconductor memory device, for performing write operation, the first unit data BL~7 and the second unit data BL8~F are sequentially input to the data I/O buffer 295, the column selection lines CSL for writing the first unit data BL~7 and the second unit data BL8~F are sequentially activated in response to a write command WR, and corresponding internal data IDQ are written to the memory cell array.

Referring to FIG. 10B, in the semiconductor memory device according to example embodiments, for performing write operation, when the first unit data BL~7 and the second unit data BL8~F are to be written to a memory, control circuitry (e.g., a memory controller 100 and/or control logic 210 or 230) is configured to determine whether each of the data units is fast data (e.g., benefits from or is required to be written to a fast cell area) or slow data (e.g., is allowed to be written to a slow cell area). Based on the determination, in one embodiment, the control circuitry may order the data to be sent to the data I/O buffer 295 as slow data first, and fast data second. For example, as depicted in FIG. 10B, if the control circuitry receives the fast data first, and slow data second, the control circuitry may change the order, so that the slow data is sent to the data I/O buffer first, and fast data is sent second. The second and first data is therefore sequentially input to the data I/O buffer 295 in response to write command WR. Then, the control logic 210 activates the first column selection line CSL_S in advance for writing the second unit data BL8~F to the first portion 311b, and the control logic 210 subsequently activates the second column selection line CSL_F for writing the first unit data BL0~7 to the second portion 313b. Accordingly, write time of the second unit data BL8~F to the first portion 311b having longer timing parameter may be secured by changing a writing order of the first and second unit data BL0~7 and BL8~F.

FIG. 11 is a flow chart illustrating a method of operating the semiconductor memory device according to some example embodiments.

Referring to FIGS. 6 and 11, in a method of operating the semiconductor memory device, a memory cell array 300b including a plurality of bank arrays 310b~380b (S410). The bank arrays 310b~380b are constituted to have first and second sub arrays 305b and 307b (S420). In one embodiment, each bank array in the first sub array 305b is constituted to have first and second portions with a 1:1 ratio (S430). Each bank array in the second sub array 307b is constituted to have first and second portions with a 1:X ratio (S430). X is a positive real number smaller than one. The first portion has a first timing parameter and the second portion has a second timing parameter, and the first timing parameter is longer than the second timing parameter. An example of a timing parameter in this embodiment is an access speed, or one or more of the other timing parameters discussed previously.

FIG. 12 is a flow chart illustrating a data input/output method of the semiconductor memory device according to some example embodiments.

Referring to FIGS. 6, 9B and 12, in a data input/output method of the semiconductor memory device, data is written in the memory cell array including a plurality of bank arrays (S510). Each of the bank arrays includes first and second portions having different timing parameters. First unit data is read from the second portion (S520). Second unit data is read from the first portion (S530). The first portion has a first timing parameter and the second portion has a second timing parameter, and the first timing parameter is longer than the second timing parameter. Since the semiconductor memory device uses separate column selection lines and separate data lines, in one embodiment, the second unit data may be read from the first portion while the first unit data read from the second portion is arranged in the data I/O buffer 295. Accordingly, slow characteristics of the first timing parameter of the first portion may be hidden externally.

Figure 13:
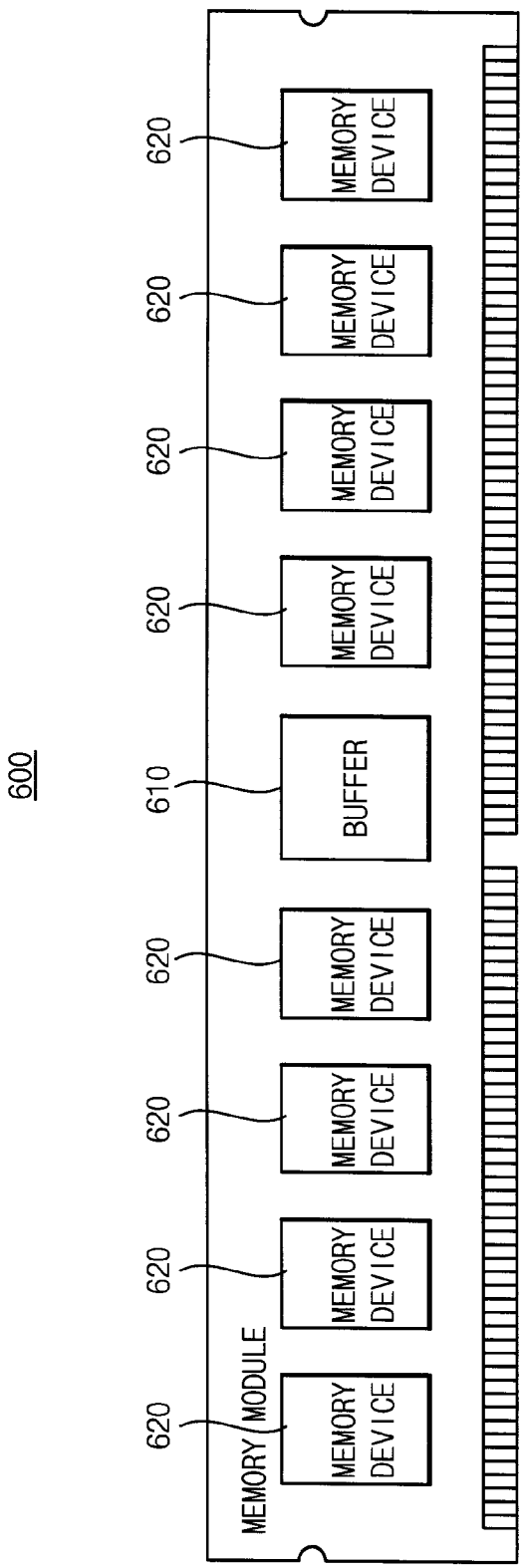
FIG. 13 is a block diagram illustrating a memory module including the semiconductor memory device according to some example embodiments.

FIG. 13 is a block diagram illustrating a memory module including the semiconductor memory device according to some example embodiments.

Referring to FIG. 13, a memory module 600 may include a plurality of semiconductor memory devices 620. In some embodiments, the memory module 600 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 600 may further include a buffer 610 that provides a command/address signal and data by buffering the command/address signal and the data from a memory controller through a plurality of transmission lines. In some embodiments, data transmission lines between the buffer 610 and the semiconductor memory devices 620 may be coupled in a point-to-point topology, and command/address transmission lines between the buffer 610 and the semiconductor memory devices 620 may be coupled in a multi-drop topology, a daisy-chain topology, a fly-by daisy-chain topology, or the like. Since the buffer 610 buffers both the command/address signal and the data, the memory controller may interface with the memory module 600 by driving only a load of the buffer 610. Accordingly, the memory module 600 may include more semiconductor memory devices and/or more memory ranks, and a memory system may include more memory modules.

Each of the semiconductor memory devices 620 may employ the semiconductor memory device 200a of FIG. 3, and a memory cell array in each of the semiconductor memory devices 620 may employ the memory cell array 300b of FIG. 6. Therefore, each of the semiconductor memory devices 620 includes a plurality of bank arrays, each having first and second portions having different timing parameters. When performing read operation and write operation, slow characteristics of the first portion may be hidden externally. In addition, low power requirements may be satisfied by storing data that allows for longer access time in the first portion and high performance requirement may be satisfied by storing data that benefits from or requires shorter access time in the second portion.

Figure 14:
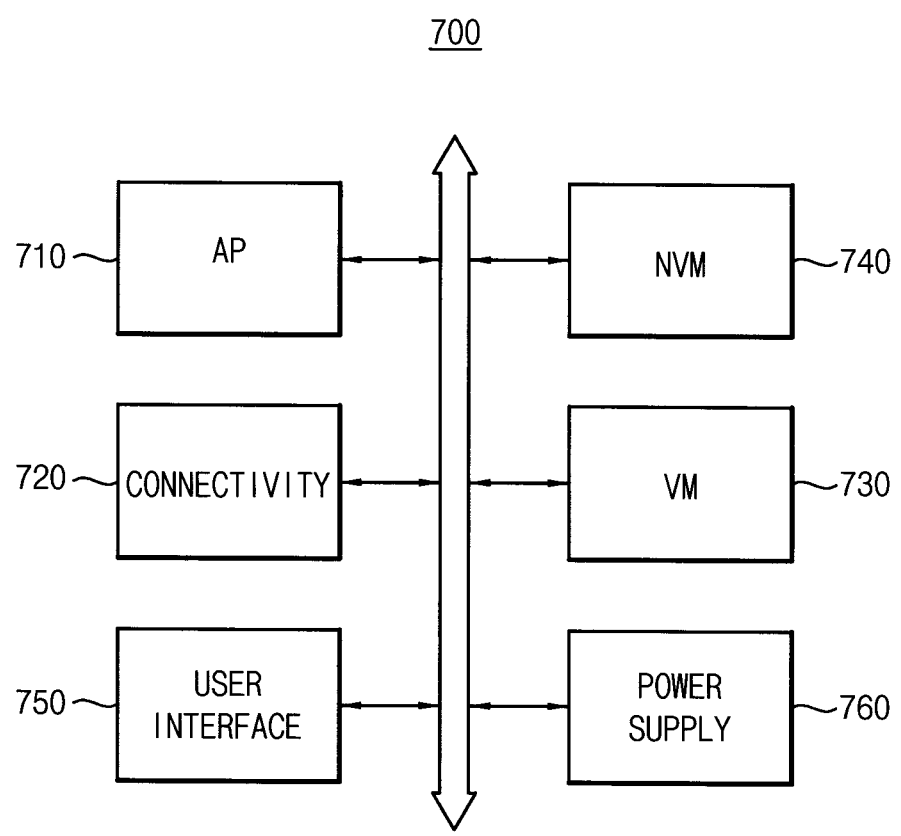
FIG. 14 is a block diagram illustrating a mobile system including the semiconductor memory device according to some example embodiments.

FIG. 14 is a block diagram illustrating a mobile system including the semiconductor memory device according to some example embodiments.

Referring to FIG. 14, a mobile system 700 includes an application processor 710, a connectivity unit 720, a semiconductor memory device 750, a nonvolatile memory device 740, a user interface 730 and a power supply 760. In some embodiments, the mobile system 700 may be a mobile phone, a smart phone, a personal digital assistant (PDA), a portable multimedia player (PMP), a digital camera, a music player, a portable game console, a navigation system, etc.

The application processor 710 may execute applications, such as a web browser, a game application, a video player, etc. In some embodiments, the application processor 710 may include a single core or multiple cores. For example, the application processor 710 may be a multi-core processor, such as a dual-core processor, a quad-core processor, a hexa-core processor, etc. The application processor 710 may include an internal or external cache memory.

The connectivity unit 720 may perform wired or wireless communication with an external device. For example, the connectivity unit 720 may perform Ethernet communication, near field communication (NFC), radio frequency identification (RFID) communication, mobile telecommunication, memory card communication, universal serial bus (USB) communication, etc. In some embodiments, connectivity unit 720 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 750 may employ the semiconductor memory device 200a of FIG. 3, and a memory cell array in the semiconductor memory device 750 may employ the memory cell array 300b of FIG. 6. Therefore, the semiconductor memory device may 750 include a plurality of bank arrays, each having first and second portions having different timing parameters. When performing read operation and write operation, slow characteristics of the first portion may be hidden externally. In addition, low power requirements may be satisfied by storing data that allows for longer access time in the first portion and high performance requirement may be satisfied by storing data that benefits from or requires shorter access time in the second portion.

The nonvolatile memory device 740 may store a boot image for booting the mobile system 700. For example, the nonvolatile memory device 740 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 730 may include at least one input device, such as a keypad, a touch screen, etc., and at least one output device, such as a speaker, a display device, etc. The power supply 760 may supply a power supply voltage to the mobile system 700. In some embodiments, the mobile system 700 may further include a camera image processor (CIS), and/or a storage device, such as a memory card, a solid state drive (SSD), a hard disk drive (HDD), a CD-ROM, etc.

In some embodiments, the mobile system 700 and/or components of the mobile system 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 15:
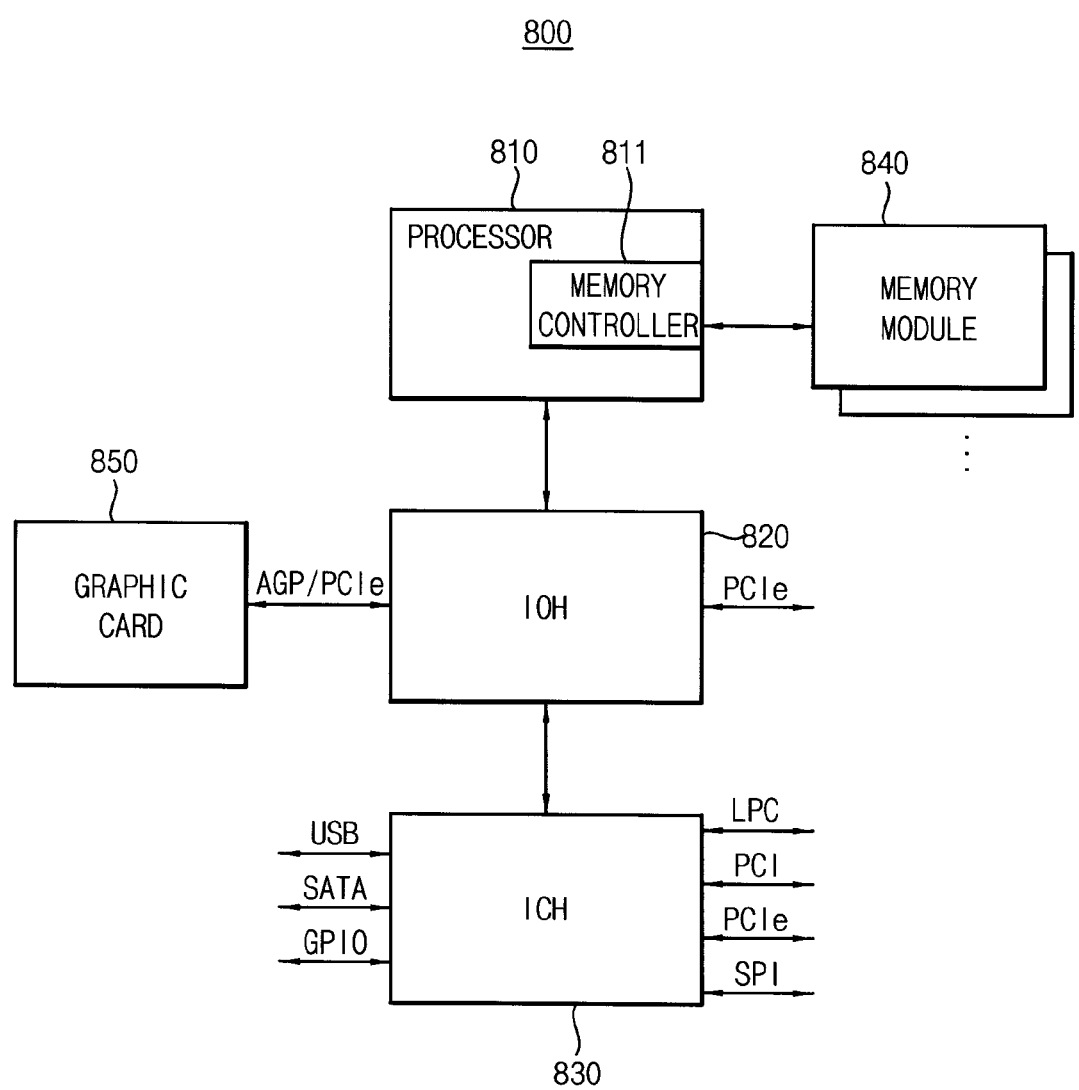
FIG. 15 is a block diagram illustrating a computing system according to some exemplary embodiments.

FIG. 15 is a block diagram illustrating a computing system according to some exemplary embodiments.

Referring to FIG. 15, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 15 illustrates the computing system 800 including one processor 810, in some embodiments, the computing system 800 may include a plurality of processors. The processor 810 may include an internal or external cache memory.

The memory module 840 may include a plurality of semiconductor memory devices that store data provided from the memory controller 811. Each of the semiconductor memory devices may employ the semiconductor memory device 300*a* of FIG. 3, and a memory cell array in each of the semiconductor memory devices may employ the memory cell array 300*b* of FIG. 6. Therefore, each of the semiconductor memory devices may include a plurality of bank arrays, each having first and second portions having different timing parameters. When performing read operation and write operation, slow characteristics of the first portion may be hidden externally. In addition, low power requirements may be satisfied by storing data that allows for longer access time in the first portion and high performance requirement may be satisfied by storing data that benefits from or requires shorter access time in the second portion.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. Although FIG. 40 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

According to example embodiments, a semiconductor memory device includes a memory cell array having a plurality of bank arrays, each having first and second portions having different timing parameters. When performing read operation and write operation, slow characteristic of the first portion may be hidden externally. In addition, low power requirement may be satisfied by storing data that allows for longer access time in the first portion and high performance requirement may be satisfied by storing data that benefits from or requires shorter access time in the second portion.

The disclosed embodiments may be applied to any systems employing the semiconductor memory devices. The disclosed embodiments may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present inventive concept as defined in the claims.

What is claimed is:

1. A semiconductor memory device, comprising:
   a memory cell array including first and second sub arrays, the first sub array including a first set of bank arrays, the second sub array including a second set of bank arrays, each of the first set and second set of bank arrays including first and second portions, having different timing parameters with respect to each other; and
   a control logic configured to control access to the first and second portions such that read/write operation is performed on the first and second portions,
   wherein when unit sizes of data are successively written in the second and first portions in response to a write command, the control logic controls the access such that a second data of the unit size, received after a first data of the unit size, is written in the first portion before the first data of the unit size is written in the second portion.

2. The semiconductor memory device of claim 1, wherein the first portion has a first timing parameter and the second portion has a second timing parameter, the first timing parameter is longer than the second timing parameter, and the control logic is configured to control the access to the first portion in response to a read/write command using a first set of data lines and a first column selection line, and to control the access to the second portion in response to the read/write command using a second set of data lines and a second column selection line.

3. The semiconductor memory device of claim 2, wherein the second portion stores data which are accessed more frequently than a reference value.

4. The semiconductor memory device of claim 2, wherein the first portion stores data which are accessed less frequently than a reference value.

5. The semiconductor memory device of claim 2, wherein when unit sizes of data are successively read from the second and first portions in response to a read command, the control logic controls the access such that a first data of the unit size is read from the second portion before a second data of the unit size is read from the first portion.

6. The semiconductor memory device of claim 5, wherein the control logic is configured to cause a first column selection signal to the second data to be activated with a delay with respect to a second column selection signal to the first data, and to cause activation intervals of the first and second column selection signals to be partially overlapped with respect to each other.

7. The semiconductor memory device of claim 6, wherein the control logic is configured to cause the second data to be read from the first portion in response to the first column selection signal while the first data read from the second portion in response to the second column selection signal are provided externally from a data input/output (I/O) buffer.

8. The semiconductor memory device of claim 1, wherein the first portion and the second portion of each array of the first set and second set of bank arrays have first and second memory capacities which are the same with respect to each other.

9. The semiconductor memory device of claim 1, wherein the first portion and the second portion of each array of the first set of bank arrays have first and second memory capacities which are the same with respect to each other and the first portion and the second portion of each array of the second set of bank arrays have third and fourth memory capacities which are different with respect to each other.

10. The semiconductor memory device of claim 9, wherein the third memory capacity is greater than the fourth memory capacity.

11. The semiconductor memory device of claim 1, wherein the semiconductor memory device is a DRAM.

12. A memory system comprising:
a semiconductor memory device configured to store data; and
a memory controller configured to control the semiconductor memory device,
wherein the semiconductor memory device comprises:
a memory cell array including first and second sub arrays, the first sub array including a first set of bank arrays, the second sub array including a second set of bank arrays, each of the first set and second set of bank arrays including first and second portions having different timing parameters with respect to each other; and
a control logic configured to control access to the first and second portions such that read/write operation is performed on the first and second portions,
wherein when unit sizes of data are successively written in the second and first portions in response to a write command, the control logic controls the access such that a second data of the unit size, received after a first data of the unit size, is written in the first portion before the first data of the unit size is written in the second portion.

13. A method of controlling a semiconductor memory device including a memory cell array including at least a first bank array having a fast cell array portion and a slow cell array portion having slower access time than the fast cell array portion, the method comprising:
receiving a read/write command for a first data of a unit size and a second data of the unit size, the first data allowing for a first access time, and the second data requiring a second access time faster than the first access time;
writing the first data to or reading the first data from the slow cell array portion; and
writing the second data to or reading the second data from the fast cell array portion.

14. The method of claim 13, further comprising:
receiving the second data for writing prior to receiving the first data for writing; and
writing the first data to the slow cell array portion and subsequently writing the second data to the fast cell array portion.

15. The method of claim 13, further comprising:
outputting the first data from the slow array portion to a data input/output (I/O) buffer; and
outputting the second data from the fast array portion to the data I/O buffer,
wherein the first data and the second data are at least partly output to the data I/O buffer at the same time.

16. The method of claim 15, wherein:
a column selection line for reading the second data from the fast array portion is enabled prior to a column selection line for reading the first data from the slow array portion.

17. The method of claim 16, wherein:
the column selection line for reading the second data from the fast array portion is separate from the column selection line for reading the first data from the slow array portion.

18. The method of claim 15, wherein:
the second data from the fast array portion is supplied to a controller as read data prior to the first data from the slow array portion being supplied to the controller as read data.

19. The method of claim 13, further comprising:
writing data having a first size to the fast array portion, and writing data having a second size larger than the first size to the slow array portion.

* * * * *